(12) United States Patent
Spampinato

(10) Patent No.: US 6,518,859 B1
(45) Date of Patent: Feb. 11, 2003

(54) FREQUENCY CONTROLLED FILTER FOR THE UHF BAND

(75) Inventor: Eric Daniel Jean Philippe Spampinato, Langouët (FR)

(73) Assignee: Itis Corporation, Cedex (FR)

( * ) Notice: Subject to any disclaimer, the term of this patent is extended or adjusted under 35 U.S.C. 154(b) by 0 days.

(21) Appl. No.: 09/654,979

(22) Filed: Sep. 5, 2000

(30) Foreign Application Priority Data

Sep. 7, 1999 (FR) .............................................. 99 11188

(51) Int. Cl.$^7$ ................................................. H03H 7/12
(52) U.S. Cl. ........................................ 333/174; 333/175
(58) Field of Search ................................ 333/174, 175, 333/168, 177, 178, 185

(56) References Cited

U.S. PATENT DOCUMENTS

| | | | | |
|---|---|---|---|---|
| 2,037,754 A | * | 4/1936 | Beers | 333/175 |
| 3,079,571 A | | 2/1963 | Elliott et al. | 333/174 |
| 3,718,874 A | | 2/1973 | Cooper, Jr. | 333/175 |
| 3,794,938 A | * | 2/1974 | Boelter | 333/70 R |
| 5,376,907 A | * | 12/1994 | Duflot et al. | 333/175 |
| 5,917,387 A | * | 6/1999 | Rice et al. | 333/174 |

FOREIGN PATENT DOCUMENTS

| | | |
|---|---|---|
| DE | 1010121 B | 6/1957 |
| DE | 1223900 B | 9/1966 |
| DE | 29508163 U1 | 9/1995 |
| EP | 0561676 A1 | 9/1993 |
| WO | WO-9013943 | * 11/1990 |

* cited by examiner

*Primary Examiner*—Seungsook Ham
(74) *Attorney, Agent, or Firm*—Tarolli, Sundheim, Covell, Tummino & Szabo L.L.P.

(57) ABSTRACT

The filter is composed of a series of cells (E1–E4) Coupled to each other by coupling capacitors (Cc12, Cc23 and Cc34), each cell forming a resonant circuit composed of at least one inductor (Ip1–Ip4) connected in parallel with at least one variable capacitor (Cp1–Cp4). The coupling capacitors (Cc12, Cc23 and Cc34) are variable capacitors. The filter is substantially symmetrical between its signal input (FI) and its signal output (FO). It finds applications notably for the transmission of channels in the UHF band, where it provides frequency agility.

17 Claims, 5 Drawing Sheets

FREQUENCY CONTROLLED FILTER FOR THE UHF BAND

BACKGROUND OF THE INVENTION

1. Field of the Invention

The present invention relates to the field of filters and notably, but not exclusively, to filters in association with modulators employed in the field of radio and television signal broadcast. In this type of application, the filters concerned by the invention are placed between the modulator circuits and the power circuit that drives the aerial.

2. Prior Art

Efforts in this field are towards totally digital transmission systems for both television and radio. Compared to analog transmission systems, digital technology allows a much denser occupation of the spectrum and a greater immunity to noise and interference problems.

For hertzian wave broadcasting, present day digital audio and video broadcast (respectively DAB and DVB) development programs aim to use the UHF IV and V carrier frequency bands.

The modulation technique envisaged, which is known in itself, is coded orthogonal frequency division multiplexing (COFDM). This protocol is used notably in European standards.

Such a form of modulation is well known, being described among others in patent documents EP-A-0 902 574 and WO-A-98 11698. Only the basic concepts shall be recalled here, with reference to FIG. 1.

This simplified diagram shows the functional units that serve to elaborate a phase quadrature modulated signal from two input signals I and Q. These two signals convey modulated information and have a 90° phase difference with respect to each other. The two signals are fed to inputs of respective mixers 2, 4 which also receive signals from a 0°/90° dephaser at the frequency $F_o = \sin w_o t$. The two respective mixers 2,4 thus supply a digital signal which is fed to respective inputs of an adder circuit 6. The output I(binary) of that circuit is supplied to the input of a digital-to-analog converter 8 to form the modulated signal I(a) to be transmitted.

This signal I(a) is generally a signal that carries a large number of carriers, for example 6800 carriers on a 7.61 MHz band, as shown in FIG. 2. This signal has a central frequency termed Fnum positioned at a frequency on the order of 18 MHz.

In order to provide power amplification to this signal, it is first necessary to transpose the frequency Fnum to a higher frequency in the UHF band.

To do this, the technique presently used involves a two-stage transposition, as shown schematically in FIG. 3. The different points of the circuit shown in FIG. 2 are identified by the letters(a) to (d); the signals at these corresponding points are depicted in FIG. 4, which is a graph showing the frequency along the X-axis and the signal level along the Y-axis.

The signal I(a) with a central frequency Fnum is processed by a classical heterodyne circuit 10 with two transposition stages. The input signal (a) passes through a first mixer circuit 12 where it is mixed with a fixed frequency signal Fol1 having a higher frequency than Fnum. This mixer circuit 12 produces at the output (b) two spectrums S1 and S2 (FIG. 4) corresponding respectively to the difference and the sum of the mixed frequencies.

These two spectrums are separated by a first bandpass type filter 14 whose output transmits only the spectrum S2 of the upper mixed frequency (C). Because the two spectrums are very close in frequency, this separation calls for a highly selective filter. To this end, a surface acoustic wave device (SAW) is normally used. This spectrum is then produced at the input of a second mixer 16 which also receives as an input a mixing frequency Fol2 having a frequency higher than Fol1. As with the first mixer circuit 12, this second mixer circuit 16 produces two spectrums S3 and S4 corresponding respectively to the difference and the sum of the frequencies in the spectrum delivered by the first filter 14 and the frequency Fol2.

The frequencies of signals Fol1 and Fol2 are chosen such that the upper frequency spectrum S4 of filter 16 corresponds to the chosen frequency band (that is the UHF IV and V bands in the example considered). This spectrum S4 is conserved by eliminating the other using a second filter 18.

In the state of the art, this second filter is fixed in frequency. In other words, it selects just one frequency—or narrow band of frequencies—by eliminating all the others. This filter is therefore chosen so as to be tuned to the desired output frequency.

Normally, as the transmitter is of the fixed frequency type, the filter 18 is selected so as to pass the range of frequencies around the carrier corresponding to the transmission channel of the UHF band. It is thus necessary to provide a different fixed filter 18 for each transmission channel.

SUMMARY OF THE INVENTION WITH OBJECTS

An object of the present invention is to provide a bandpass filter of variable frequency so that it can adapt to different channels, notably in the 400 MHz to 1 GHz frequency band.

In the example considered, such a filter can be implemented as a replacement for the fixed filter 18 to provide flexibility to the circuit 10 with respect to the different channels which can be used.

To this end, a first object of the present invention is to provide a bandpass filter with adjustable central frequency and operative in the UHF band, characterized in that it comprises a series of cells coupled to each other by coupling capacitors, each cell forming a resonant circuit composed of at least one inductor connected in parallel with at least one variable capacitor.

Advantageously, the coupling capacitors are also variable capacitors.

According to a particularly remarkable characteristic of the invention, the filter can be made substantially symmetrical between its signal input and its signal output.

In a preferred embodiment the cells are four in number.

Preferably, each variable capacitor forming the resonant circuits and each variable coupling capacitor is in the form of at least one electrically controllable variable capacitor.

In this case, it is possible to provide that each electrically controllable variable capacitor is formed by at least one voltage controlled variable capacitance diode.

Preferably, each variable coupling capacitor is formed by a pair of variable capacitor diodes connected head to head.

In order to provide an optimization of the input and output impedance matching characteristics, the filter can comprise an input connected to an intermediate tapping of the inductor of the first cell of the series of cells and an output connected to an intermediate tapping of the inductor of the last cell of the series of cells.

Advantageously, the inductors of the first cell and the last cell have a value different from that of the inductor(s) of the intermediate cell(s), the difference in value enabling to employ a same variable control voltage for controlling on the one hand the electrically controllable capacitors of the resonant circuits formed by the first and last cells and on the other hand the electrically controllable capacitor(s) of the resonant circuit(s) formed by the intermediate cell(s).

In this case, the inductors of the first cell and the last cell preferably have an inductance value greater than that of the inductors of the intermediate cell(s)

For an easier implementation of the filter, it is possible to provide that the electrically controllable variable capacitors respectively forming the coupling between the first cell and the cell adjacent to the latter and the coupling between the last cell and the cell adjacent to the latter have a same capacitance value for a same capacitance control voltage over a determined range of control voltages.

Preferably, each inductor is in the form of a microstrip deposited on an insulating substrate.

A second object of the present invention is to provide a bandpass filtering circuit with adjustable central frequency operational in the UHF band, characterized in that it comprises a filter such as described above and voltage supply means for controlling the central frequency.

Advantageously, the voltage supply means produces a first voltage supplied to the inputs controlling the capacitance value of the capacitors forming the resonant circuits of the respective cells, a second voltage supplied to the inputs controlling the capacitance value of the coupling capacitors forming respectively the coupling between the first cell and the cell adjacent to the latter and the coupling between the last cell and the cell adjacent to the latter, and a third voltage supplied to the input controlling the capacitance value of intermediate coupling capacitor(s).

Advantageously, the third voltage is proportional to the first voltage.

Thus, in the application considered, there is a first transposition which is most generally always carried out at a fixed frequency. However, by virtue of the present invention, the second transposition can be frequency agile, the agility being followed by the adjustable filter of the invention.

There is still a transposition which starts from the base band to the signal having an intermediate frequency around Fol1, which can be fixed and for which standard intermediate frequencies can be found. Filters of different sources are indeed abundant on the market, whether they be surface acoustic wave (SAW) devices or other.

On the other hand, the second transposition is very often carried out using a filter to obtain the frequency of the channel, the latter having a much broader band and having to be able to cover all the band, for example bands IV and V in television, which can occupy one frequency octave. And this is where the second transposition gains in being frequency agile.

However, what up until now prevented frequency agility in systems was precisely the fact that there exists no filter which is frequency agile. Indeed, all the filters used are only manually and factory adjustable, and are of large size.

By virtue of the controllable frequency filter of the invention, it is possible to implement a circuit which also possesses agility at the level of the frequency synthesis to generates signals Fol1 and, especially, Fol2 : this agility shall then be followed by the agility of the variable frequency filter to deliver a signal at the desired frequency.

Frequency synthesizers agile in the UHF band are now well developed. Indeed, before these synthesizers, quartz oscillators trimmed to a given frequency were used. The frequency of the quartz was then multiplied to arrive up to the UHF transposition frequency, that is comprised between the 470 MHz–860 MHz band minus the intermediate frequency (since it is here the transposition frequency Fol2). However, it was in this case frequency synthesis at fixed frequency.

Nowadays, frequency synthesis has evolved and allows agility at the level of the above transmission systems, except that the second frequency transposition (at frequency Fol2) requires filtering spurious—and therefore undesirable—band mixtures. This was where agility and integration were lacking.

Thus, by virtue of the invention, there is no longer any need to insert a fixed, factory-calibrated filter 18 in the circuit 10 of FIG. 3: the apparatus is a system that will allow the frequency transposition in a frequency agile manner up to the output to the power amplifier.

BRIEF DESCRIPTION OF THE FIGURES

The invention shall be more clearly understood and its resulting advantages shall appear more clearly from reading the description of a preferred embodiment, given purely as a non-limiting example, with reference to the appended drawings in which.

DETAILED DESCRIPTION OF THE PREFERRED EMBODIMENTS

The purpose of the filter according to the present invention shall be described with reference to FIG. 5 which is partly based on the context already described with reference to FIG. 3. Accordingly, the parts common to the two Figs. have the same references and shall not be described again for conciseness.

Figure 5:
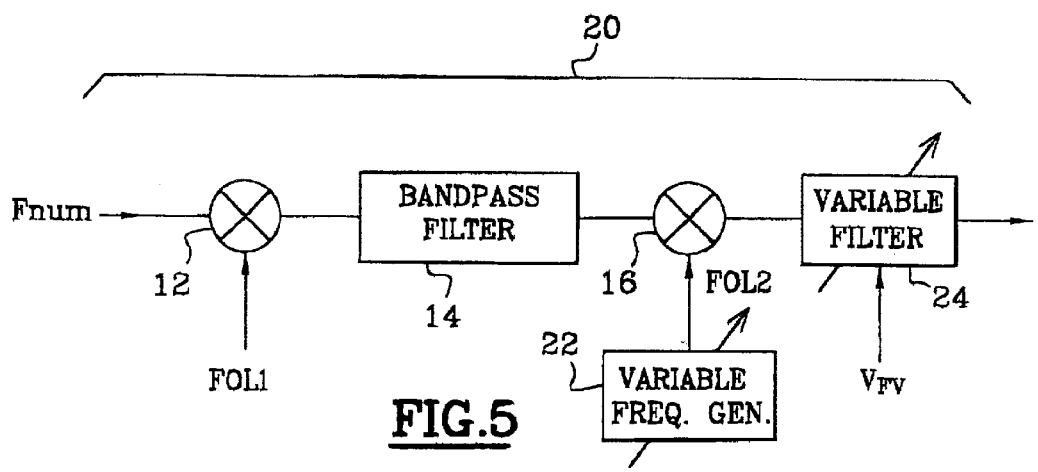
FIG. 5 is a simplified block diagram of a circuit for transposing the frequency of the signal shown in FIG. 2 using a filter in accordance with the invention.

Note that the circuit of FIG. 5 is identical at the level of input signal Fnum, the first mixer 12, the first bandpass filter 14 and the second mixer circuit 16.

Figure 1:
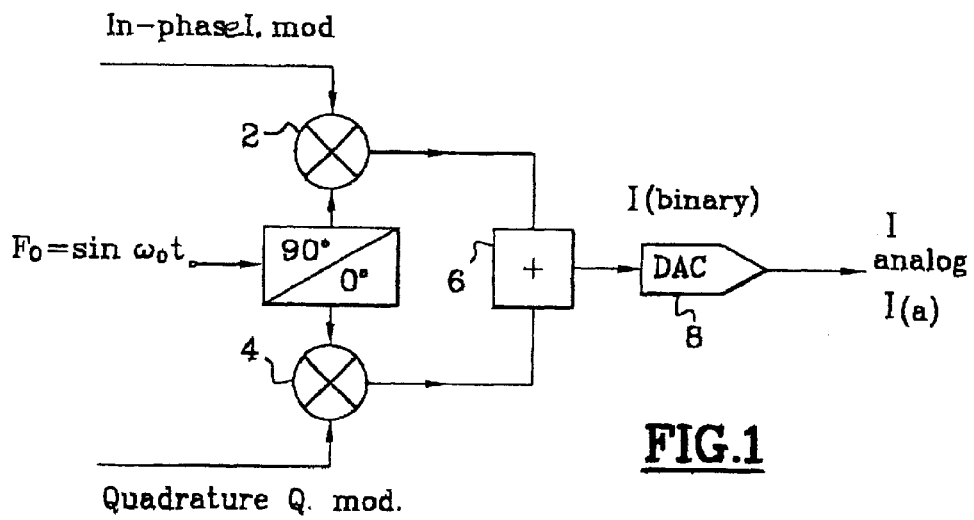
FIG. 1 already described, is a simplified block diagram of a modulation stage according to the COFDM technique.
Figure 2:
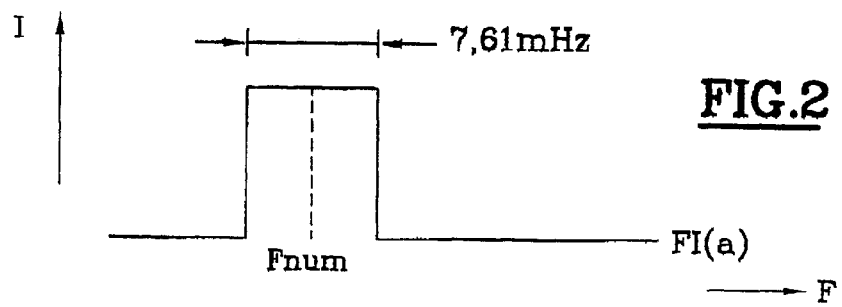
FIG. 2 already described, shows the frequency spectrum obtained at the output of the modulation stage of FIG. 1.
Figure 3:
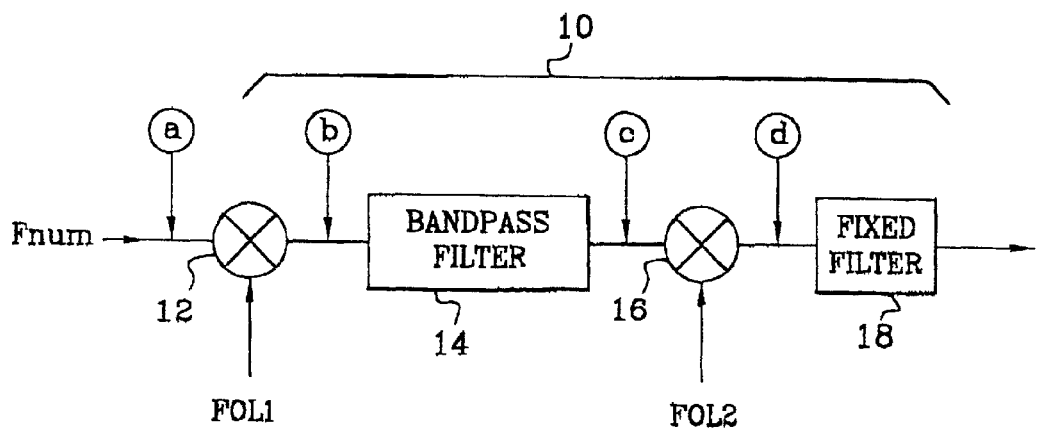
FIG. 3 already described, is a simplified block diagram of a circuit for transposing the frequency of the signal shown in FIG. 2 according to the state of the art.
Figure 4:
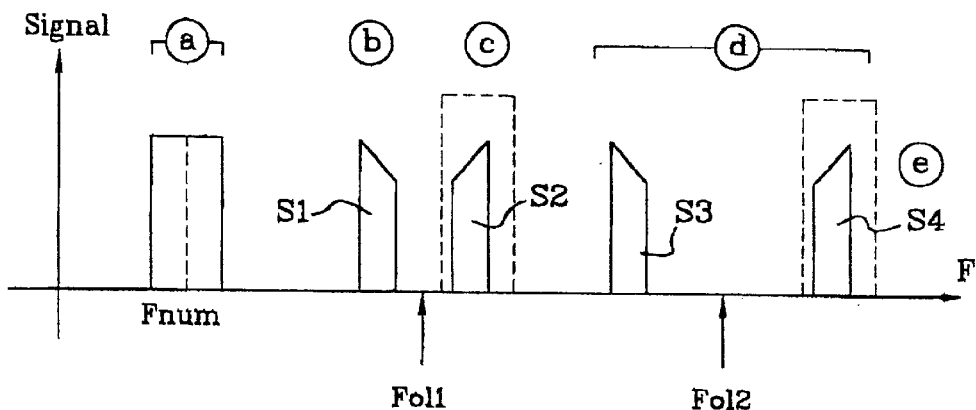
FIG. 4 already described, shows the signals at different points of the circuit shown in FIG. 3.

By contrast with the circuit of FIG. 3, the second mixer circuit 16 receives as an input a frequency Fol2 which is not fixed but variable. This signal Fol2 is produced by a variable frequency generator 22. The latter can be constructed using a phase-locked loop (PLL) synthesizer known in itself. Its frequency band corresponds substantially to the frequency band desired at the output, i.e. on the order of 400 MHz to 1 GHz.

The technology for constructing such a variable frequency oscillator 22 is known in itself and shall not be described for conciseness.

By varying the frequency Fol2 at the mixer, there is obtained a corresponding variation of the intermediate transposition frequency supplied at the output of the mixer 16. This variable frequency shall then be filtered by a variable frequency bandpass filter 24 according to the present invention.

The detailed structure of this filter shall be described further. It will here be considered as a functional unit which receives at its input a signal from the mixer 16 and lets pass at its output the component of that signal situated in a narrow frequency band. The central frequency of this band is determined by a control signal in the form of a set of variable voltage signals Vfv.

Figure 6:
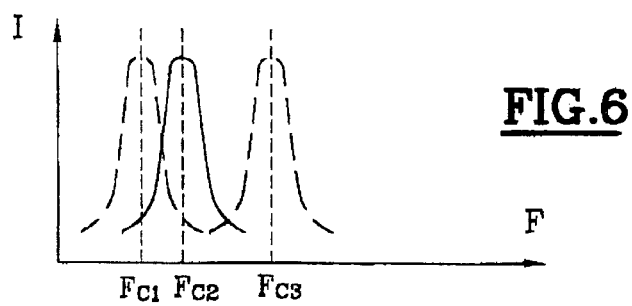
FIG. 6 is a diagram showing three response curves of the filter in accordance with the invention.

FIG. 6 shows three examples of responses of the filter 24 as a function of three respective values of the set of variable voltages Vfv. The central frequency fc2 is located at an intermediate level of Vfv, while the central frequencies fc1 and fc3 correspond respectively to voltages below and above this intermediate level fc2.

The variable filter 24 according to the invention thus makes it possible to sweep the entire UHF spectrum, i.e. 400 MHz to 1 GHz with its central frequency.

In the circuit 20, the variable filter 24 forms with the variable frequency generator 22 a tuned system enabling to obtain a transposed frequency selected at any position of the UHF frequency spectrum. To this end, all that is required is to set the frequency of the frequency generator 22 to a value which, added to the frequency of the signal from bandpass the filter 14, corresponds to the value of the required output frequency. The central frequency fc of the variable filter is adjusted in concert so that the latter corresponds to this frequency value. Accordingly, the filter will allow only that frequency to pass, with a narrow band sharply attenuated around that frequency. The signal delivered from the filter 24 can thus, depending on the application, drive an amplification stage to feed a transmission aerial.

For this application, it will be understood that it is simple to change the transmission frequency or to select a specific transmission frequency in the UHF band without having to change components or to make physical adjustments to the latter. Indeed, all that is required is to control, with appropriate signals that are easy to generate, the variable frequency generator (generally by a variable voltage on a voltage controlled oscillator) and the variable filter.

Figure 7:
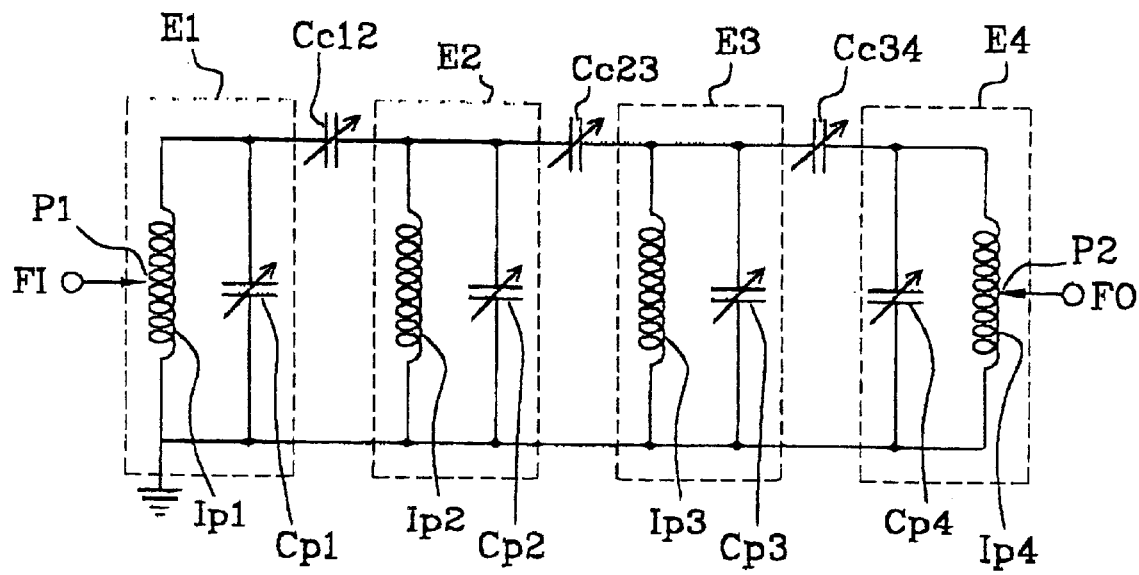
FIG. 7 is a circuit diagram of a filter in accordance with the present invention.

The theoretical diagram of the variable frequency filter shall now be described with reference to FIG. 7.

In the example, the filter comprises four stages or cells E1, E2, E3, E4 forming a chain, cells E1 and E4 being at respective ends of the chain of cells. Each cell comprises a parallel connection of a capacitor Cp1, Cp2, Cp3 and Cp4 and an inductor Ip1, Ip2, Ip3 and Ip4.

Adjacent cells are interconnected by coupling capacitors Cc12, Cc23 and Cc34. In the example, there are thus three coupling capacitors Cc12, Cc23 and Cc34 respectively connecting cells E1 and E2, cells E2 and E3, and cells E3 and E4.

The nodes of each parallel connection of each cell, at the end opposite the coupling capacitors Cc12, Cc23 and Cc34 are all connected to ground.

The inductors Ip1 and Ip4 associated to cells E1 and E4 at each end of the filter 24 each comprise an intermediate tapping P1 and P2 between their ends. Intermediate tapping P1 on inductor Ip1 is connected to an input FI of the filter; intermediate tapping P2 on inductor Ip4 is connected to an output FO of the filter.

This arrangement enables to confer the inductors IP1 and IP4, located at the ends of filter 24, the additional function of an autotransformer which, as shall be explained below, makes it possible to adapt filter's input and output impedances.

In an application such as the circuit 20 shown in FIG. 5, it is important to have an output impedance adapted to the input impedance. By virtue of the dual function provided by inductors Ip1 and Ip4 (inductor per se and autotransformer), it is possible to obtain the desired input impedance and output impedance for the filter without altering the characteristics of the latter. In the example considered, the input and output impedances are chosen so as to be substantially the same and equal to about 50 Ohms.

According to a preferred embodiment, all the capacitors of the filter 24—the capacitors Cc12, Cc23 and Cc34 serving for the coupling as well as capacitors Cp1, Cp2, Cp3 and Cp4 connected in parallel—are is electrically variable.

Preferably, this feature is obtained by using "varicap diodes" for these capacitors, which are known per se.

Note that the filter is perfectly symmetrical in the sense that the input and output can be inverted without altering the filtering characteristics.

Figure 8:
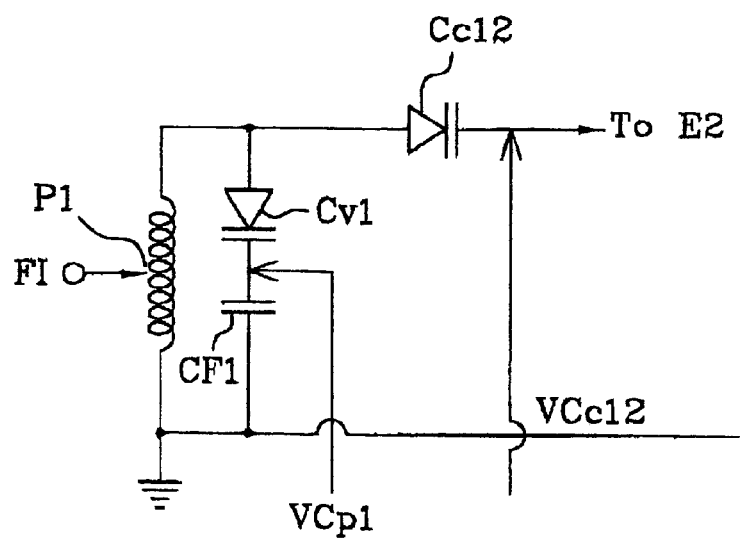
FIG. 8 is a diagram of a first cell of the filter of FIG. 7 according to a first embodiment of the invention.

FIG. 8 shows a cell E1 of the filter with its coupling capacitor to the neighboring cell E2.

In the example, the capacitor Cp1 connected in parallel is decomposed into two capacitors connected in series, namely a varicap type capacitor Cv1 and a fixed capacitor Cf1 having respective capacitances v1 and f1. Accordingly, the total capacitance of this parallel connection is Ccq=f1v1/(v1+f1). The fixed capacitor Cf1 serves to electrically isolate the varicap diode Cv1 from the ground so as to allow its biasing following a classical technique. Its value is typically 470 picoFarads. It shall be understood that by varying the value of v1 it is possible to obtain all desired capacitance values.

The value of capacitor Cv1 is determined by the value of a voltage VCp1 applied to the varicap diode forming the capacitor Cv1.

Likewise, the value of coupling capacitor Cc12 is determined by the value of a voltage VCc12 applied to the varicap diode that constitutes this coupling capacitor.

Figure 9:
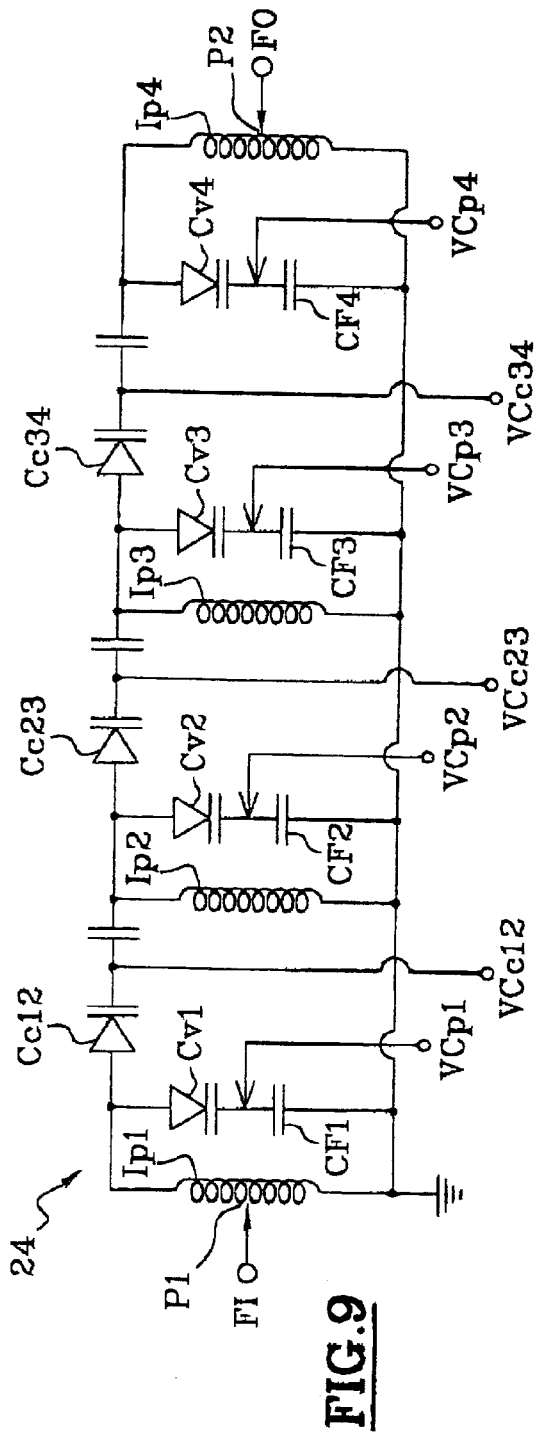
FIG. 9 is a diagram of the entire filter shown in FIG. 8.

FIG. 9 shows the complete circuit formed by varicap diodes such as shown in FIG. 8, as well as the voltage values that control these diodes. This Fig. also serves to identify schematically the designations of these different control voltages which shall not be enumerated for conciseness.

Figure 10:
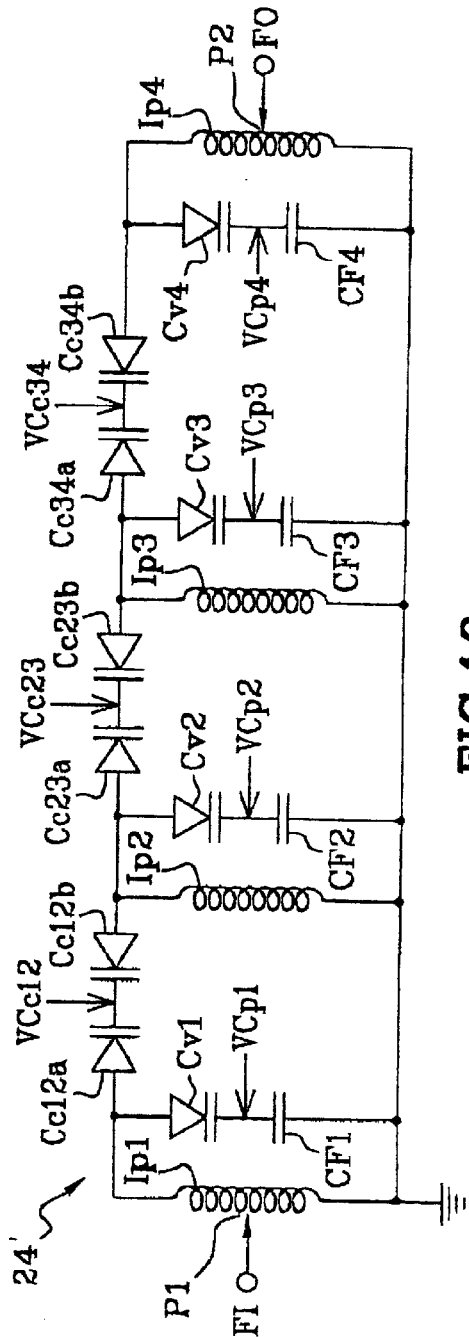
FIG. 10 is a diagram of the filter shown in FIG. 7 according to a second embodiment of the invention.

FIG. 10 shows a variant of the filter shown in FIG. 9 which is advantageous due to the fact that it enables the noise generated by the varicap diodes to be reduced.

The circuit 24' according to this variant differs from the circuit 24 of FIG. 9 solely by the fact that each of the coupling capacitors Cc12, Cc23 and Cc34 of the latter is replaced by a pair of varicap diodes connected head to head Cc12a–Cc12b, Cc23a–Cc23b, Cc34a–Cc34b.

Advantageously, in this case, a control voltage is applied to each pair of diodes at the junction point of the latter, creating a decoupling capacitor. For each pair of diodes connected head to head Cc12a–Cc12b, Cc23a–Cc23b, Cc34a–Cc34b, the control voltage VCc12, VCc23, VCc34 is the same as for the corresponding coupling varicap diodes of FIG. 9.

Because the filter is exploited at very high frequencies, it is constructed using microstrip line technology to form the inductors. Such microstrip lines are made by metallizing strips on a glass substrate covered with a Teflon coating. In this way, the entire filter is mounted on this substrate.

As is well established, the inductance value of an inductor in the form of a microstrip is a function of the length of the latter. However, in order that the microstrip acts like a local component, and not like a distributed element, the maximum length of each microstrip section serving as an inductor is limited to a value less than or equal to lambda/10, where lambda is the minimum wavelength of the signal to be filtered.

In a practical example, the substrate has a 70 mm by 40 mm format with a thickness of 0.8 mm.

The varicap diodes are found among commercially available components. They are mounted on the substrate in accordance with classical microwave circuit mounting techniques.

As shown in FIGS. 9 and 10, there are seven control inputs to consider for the case of a filter comprising four cells E1–E4, each voltage control input being associated to a respective varicap diode or pair of varicap diodes in the case of coupling capacitors shown in FIG. 10.

The filter having been designed with an intrinsically symmetrical configuration, it is possible to establish an identity of capacitance values for different capacitors. Assuming that varicap diodes having the same characteristics are chosen for the parallel capacitors Cp1 to Cp4 and that, likewise, varicap diodes also having the same characteristics are chosen for the coupling capacitors Cc12, Cc23 and Cc34, it is possible to establish by symmetry (cf. FIG. 9 or 10)that:

VCp1=VCp4
VCp2=VCp3
VCc12=VCc34.

There thus remains a capacitance value at the center of symmetry, namely that of the coupling varicap diode Cc23 or Cc23a, Cc23b which remains apart.

Accordingly, by virtue of this symmetry in accordance with the embodiment, one passes from seven to four voltage levels to consider for setting the filter to the desired central frequency value.

In striving to simplify the implementation of the filter—by a reduction in the number of different voltages to apply—the applicant considered the possibility of using one and the same control voltage for all four varicap diodes Cv1 to Cv4 forming the capacitors in the parallel resonance circuits, which then gives VCp1=VCp2, for example. To this end, the applicant considered modifying the parameter fixing the lengths of the microstrips that respectively constitute inductors Ip1 and Ip4 of the filter's input and output cells E1 and E4. It turned out that a reduction in the length of microstrips that respectively constitute inductors Ip2 and Ip3 effectively makes it possible to set to a common value all the control voltages of varicap diodes VCp1 to VCp4 forming the parallel resonance circuits. From that teaching, it is possible to calculate the degree of shortening required for the microstrip lines to obtain this result, or to apply an empirical approach. The degree of shortening is a function of the value of the varicap diodes used, the inductors and the balance of components that make up the filter.

In certain cases, it can turn out that the length of the microstrip lines forming the above-mentioned inductors Ip1 and Ip4 should on the contrary be increased, depending on the filter's tuning characteristics. In this case too, an analytical or empirical approach will serve to establish the appropriate degree of lengthening required.

Desirably, the input or output impedance of the filter following this tuning operation is not modified beyond required tolerances so as not to impair the desired transfer function.

By virtue of this arrangement, there only remains three control voltages to consider, namely:

the single voltage to control all of varicap diodes Cv1 to Cv4;

the single voltage to control the two varicap diodes (FIG. 9) or the two pairs of varicap diodes (FIG. 10) forming the coupling capacitors for input and output cells E1 and E4, respectively Cc12 and Cc34, and Cc12a–Cc12b and Cc34a–Cc34b; and the voltage to control the varicap diode (FIG. 9) or the pair of varicap diodes (FIG. 10) forming the coupling capacitor between the two internal cells E2 and E3, respectively Cc23 and Cc23a–Cc23b.

In pursuing his search for simplification, the applicant attempted to associate this latter voltage with one of the two others.

It turned out that, contrary to what an a priori analysis would lead to consider, this control voltage could be linked not to the one that controls the other varicap diodes forming the coupling capacitors, but rather to the voltage that controls varicap diodes Cv1 to Cv4 of the parallel resonant circuits. More precisely, it was found that the voltage for controlling the varicap diode (FIG. 9) or the pair of varicap diodes (FIG. 10) forming the coupling capacitor between the two internal cells E2 and E3, respectively Cc23 and Cc23a–Cc23b, is proportional to the single voltage for controlling the varicap diodes forming the resonant circuits.

Accordingly, all that is required is to provide in the filter—or in annex to the latter—a circuit which, from one or the other of the two mutually proportional voltages, produces the other of these control voltages.

This function can notably be obtained by a classical divider bridge circuit formed by two resistors in series.

Figure 11:
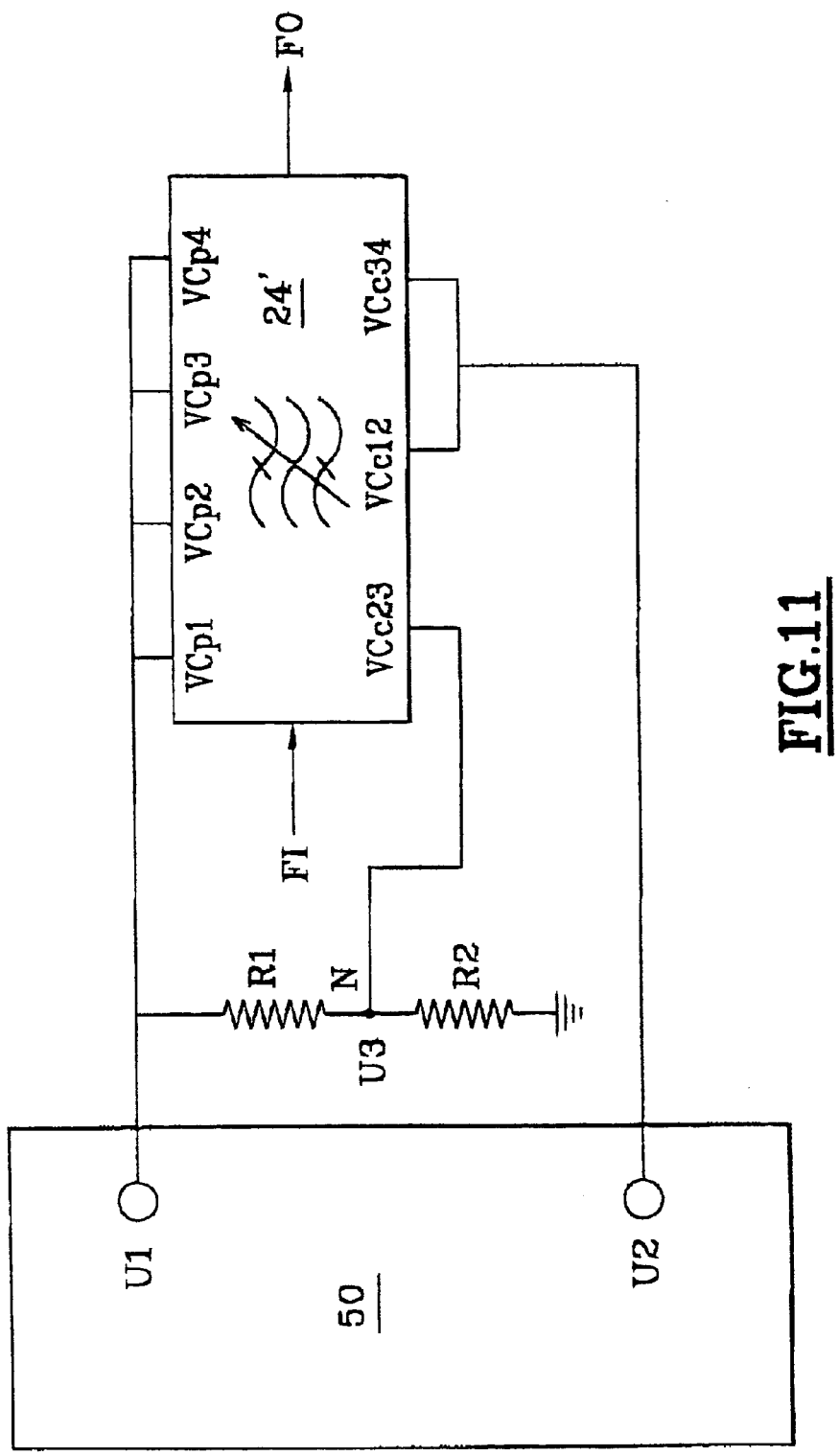
FIG. 11 is a diagram showing a circuit application for the filter of FIG. 10.

FIG. 11 is a schematic representation of the filter 24' depicted in FIG. 10, showing in block form all the seven above-mentioned control inputs VCp1–VCp4 and Vc23–Vc34 as well as the signal input and output FI and FO.

In accordance with the foregoing analysis, the is four voltages VCp1–VCp4 that control the varicap diodes Cv1, Cv2, Cv3 and Cv4 forming the parallel-connected capacitors are commonly supplied with a first voltage output U1 from a power supply 50. The two voltages VCc12 and VCc34 that control the varicap diodes forming coupling capacitors Cc12a–Cc12b and Cc34a–Cc34b respectively are commonly supplied with a second voltage output U2 from the power supply 50.

The control voltage VCc23 for the pair of varicap diodes that forms the central capacitor Cc23 or Cc23a–Cc23b is supplied from a common node N of a divider bridge formed by two resistors R1 and R2 connected in series. One of the ends of the bridge is connected to voltage output U1, while the other end is connected to ground. The values of resistors R1 and R2 are calculated so that the voltage U3 at node N corresponds to the above-mentioned control voltage Vc23.

Note that the output voltage U3 is proportional to voltage U1, in accordance with the preceding analysis.

However, it is possible as a variant to connect the divider bridge not to the U1 output voltage but to the U2 output voltage so that the output voltage U3 is proportional to the voltage U2.

Note that the voltage source necessary for the control of the filter's central frequency need only have two different voltages, namely U1 and U2, the voltage U3 being intermediate and derived directly from voltage U1.

The invention is thus remarkable in that by virtue on the one hand of the symmetrical configuration of the filter and on the hand the adaptation of the internal components, it is possible to control seven separate capacitors that play an active part in the operation using just two independent voltages.

Note also that the operating principle of the filter 24' rests on four capacitively resonator cells. The filter approaches an equivalent model of four capacitively coupled parallel LC resonators.

This design in conformance with the present invention presently appears as optimal for constructing a filter in the UHF band with a bandwidth of 10% maximum.

Passband filters of classical design for that type of application are based on the principle of low pass to passband transformations and only achieve a typical performance of 30% bandwidth with respect to frequency.

It appears that the technique that allows to obtain a filtering cell whose passband is less than 10% of the central frequency can only be obtained by coupling resonant elements in parallel. Now, in the state of the art, there exist no polynomial solutions for cells which are absolutely symmetrical. Thus, to produce a filter according to the polynomial model in the state of the art, there would have been an absolute need for seven different control voltages.

The characteristics of the filter according to the embodiment of FIG. 10 are given below as a non-limiting example:

Central frequency range Fc: 470 to 860 MHz

Attenuation:
  <–60 dBc at Fc–140 MHz
  <–60 dBc at Fc+200 MHz

Input impedance: 50 Ohms

Output impedance: 50 Ohms

U1 control voltage range: 1 to 18 v

U2 control voltage range: 1 to 6 v

U3 control voltage range: 1 to 9 v

Value of inductor Ip1 or Ip4 at input or output: length of microstrip lines=20 mm; width=2 mm Values of inductors Ip2 or Ip3 of intermediate cells E2 and E3: length=17 mm; width=2 mm Capacitance value of varicap diodes Cv1–Cv4 of the resonant circuits: 2 to 15 pF Capacitance value of varicap diodes Cc12, Cc23, Cc34 of coupling capacitors: 0.5 to 4 pF.

What is claimed is:

1. Bandpass filter (24; 24') with adjustable central frequency and operative in the UHF band, characterized in that the filter comprises a series of cells (E1–E4), including a first cell (E1), a last cell (E4), and at least one intermediate cell (E2 and E3), coupled to each. other by coupling capacitors (Cc12, Cc23 and Cc34; Cc12a–Cc12b, Cc23a–Cc23b and Cc34a–Cc34b), each cell forming a resonant circuit composed of at least one inductor (Ip1–Ip4) connected in parallel with at least one electrically controllable variable capacitor (Cp1–Cp4) having input means by which a variable control voltage is applied to vary the capacitance thereof, where the inductors (Ip1 and Ip4) of the first cell (E1) and the last cell (E4) have an inductance value different from that of the inductor(s) (Ip2, Ip3) of the intermediate cell(s) (E2, E3), the difference in value enabling the filter to employ a same variable control voltage for controlling both the electrically variable capacitors of the resonant circuits formed by the first and last cells and the electrically variable capacitor(s) of the resonant circuit(s) formed by the intermediate cell(s).

2. Bandpass filter according to claim 1, characterized in that the coupling capacitors (Cc12, Cc23 and Cc34; Cc12a–Cc12b, Cc23a–Cc23b and Cc34a–Cc34b) are variable capacitors.

3. Bandpass filter according to claim 1, characterized in that the filter is substantially electrically symmetrical between its signal input (FI) and its signal output (FO).

4. Bandpass filter according to claim 1, characterized in that the series of cells (E1–E4) are four in number.

5. Bandpass filter according to claim 2, characterized in that each variable coupling capacitor (Cc12, Cc23, Cc34; Cc12a–Cc12b, Cc23a–Cc23b and Cc34a–Cc34b) is in the form of at least one electrically controllable variable capacitor (Cc12; Cc12a–Cc12b, Cc23; Cc23a–Cc23b, Cc34; Cc34a–Cc34b), each having input means by which a variable control voltage is applied to vary the capacitance thereof.

6. A bandpass filter according to claim 5, characterized in that each electrically controllable variable capacitor is formed by at least one voltage controlled capacitance diode.

7. Bandpass filter according to claim 2, characterized in that each variable coupling capacitor (Cc12, Cc23, Cc34) is formed by a pair of variable capacitor diodes (Cc12a–Cc12b, Cc23a–Cc23b, Cc34a–Cc34b) connected head to head.

8. Bandpass filter according to claim 1, characterized in that the filter comprises an input (FI) connected to an intermediate tapping of one of the at least one inductor(s) (Ip1) of the first cell (E1) of said series of cells and an output (FO) connected to an intermediate tapping of one of the at least one inductor(s) (Ip4) of the last cell (E4) of said series of cells.

9. Bandpass filter according to claim 1, characterized in that each of the at least one inductor(s) (Ip1 and Ip4) of said first cell (E1) and said last cell (E4) have an inductance value greater than that of each of the at least one inductor(s) (Ip2, Ip3) of the intermediate cells (E2, E3).

10. Bandpass filter according to claim 5, characterized in that the electrically variable capacitors (Cc12, Cc34; Cc12a–Cc12b; Cc34a–Cc34b) respectively forming coupling capacitors between the first cell (E1) and the cell (E2) adjacent to the first cell and coupling capacitors between the last cell (E4) and the cell adjacent to the last cell have a same capacitance value for a same capacitance control voltage over a determined range of control voltages.

11. Bandpass filter according to claim 1, characterized in that each inductor (Ip1–Ip4) is in the form of a microstrip deposited on an insulating substrate.

12. Bandpass filtering circuit with adjustable central frequency operational in the UHF band, characterized in that the circuit comprises a filter (24; 24') according to claim 1 and voltage supply means for controlling the central frequency.

13. Circuit according to claim 12, characterized in that the voltage supply means produces a first voltage (U1) supplied to the input means controlling the capacitance value of said capacitors (Cv1, Cv2, Cv3, Cv4) forming the. resonant circuits of the respective cells (E1–E4), a second voltage (U2) supplied to the input means- controlling the capacitance value of said coupling capacitors (Cc12, Cc34; Cc12a–Cc12b; Cc34a–Cc34b) forming respectively the coupling between the first cell (E1) and the cell (E2) adjacent to the first cell and the coupling between the last cell (E4) and the cell adjacent to the last cell, and a third voltage (U3) supplied to the input means controlling the capacitance value of said coupling capacitor(s) (Cc23; Cc23a–Cc23b), forming the coupling between the intermediate cells (E2 and E3).

14. Circuit according to claim 13, characterized in that said third voltage (U3) is proportional to said first voltage (U1).

15. Bandpass filter (24; 24') with adjustable central frequency and operative in the UHF band, characterized in that the filter comprises a series of four cells (E1–E4), including a first cell (E1), a last cell (E4), and two intermediate cells (E2 and E3), coupled to each other by coupling capacitors (Cc12, Cc23 and Cc34; Cc12a–Cc12b, Cc23a–Cc23b and Cc34a–Cc34b), each cell forming a resonant circuit composed of at least one inductor (Ip1–Ip4) connected in parallel with at least one electrically controllable variable capacitor (Cp1–Cp4) having input means by which a variable control voltage is applied to vary the capacitance thereof, where the inductors (Ip1 and Ip4) of the first cell (E1) and the last cell (E4) have an inductance value different from that of the inductors (Ip2, Ip3) of the intermediate cells (E2, E3), the difference in value enabling the filter to employ a same variable control voltage for controlling both the electrically variable capacitors of the resonant circuits formed by the first and last cells and the electrically variable capacitors of the resonant circuits formed by the intermediate cells.

16. A bandpass filtering circuit with adjustable central frequency operational in the UHF band, characterized in that it comprises a filter (24; 24') with adjustable central frequency, characterized in that the filter comprises a series of cells (E1–E4), including a first cell (E1), a last cell (E4), and at least one intermediate cell (E2 and E3), coupled to each other by electrically variable coupling capacitors (Cc12, Cc23 and Cc34; Cc12a–Cc12b, Cc23a–Cc23b and Cc34a–Cc34b) each having input means by which a variable control voltage is applied to vary the capacitance thereof, each cell forming a resonant circuit composed of at least one inductor (Ip1–Ip4) connected in parallel with at least one electrically controllable variable capacitor (Cp1–Cp4) having input means by which a variable control voltage is applied to vary the capacitance thereof, where the inductors (Ip1 and Ip4) of the first cell (E1) and the last cell (E4) have an inductance value different from that of the inductor(s) (Ip2, Ip3) of the intermediate cell(s) (E2, E3), the difference in value enabling the filter to employ a same variable control voltage for controlling both the electrically variable capacitors of the resonant circuits formed by the first and last cells and the electrically variable capacitor(s) of the resonant circuit(s) formed by the intermediate cell(s), and voltage supply means for controlling the central frequency, said voltage supply means producing a first voltage (U1) supplied to the input means controlling the capacitance value of said capacitors (Cv1, Cv2, Cv3, Cv4) forming the resonant circuits of the respective cells (E1–E4), a second voltage (U2) supplied to the input means controlling the capacitance value of said coupling capacitors (Cc12, Cc34; Cc12a–Cc12b; Cc34a–Cc34b) forming respectively the coupling between the first cell (E1) and the cell (E2) adjacent to the first cell and the coupling between the last cell (E4) and the cell adjacent to the last cell, and a third voltage (U3) supplied to the input means controlling the capacitance value of said coupling capacitor(s) (Cc23; Cc23a–Cc23b), forming the coupling between the intermediate cells (E2 and E3).

17. A circuit according to claim 16, characterized in that said third voltage (U3) is proportional to said first voltage (U1).

* * * * *